(12) United States Patent
Singh (10) Patent No.: US 12,324,217 B2
(45) Date of Patent: Jun. 3, 2025

(54) LATERALLY DIFFUSED METAL-OXIDE SEMICONDUCTOR WITH GATE CONTACT

(71) Applicant: GLOBALFOUNDRIES U.S. Inc., Malta, NY (US)

(72) Inventor: Jagar Singh, Clifton Park, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 432 days.

(21) Appl. No.: 17/708,698

(22) Filed: Mar. 30, 2022

(65) Prior Publication Data

US 2023/0317815 A1    Oct. 5, 2023

(51) Int. Cl.
  *H10D 64/66*   (2025.01)
  *H10D 30/01*   (2025.01)
  *H10D 30/65*   (2025.01)
  *H10D 62/10*   (2025.01)
  *H10D 64/01*   (2025.01)

(52) U.S. Cl.
  CPC ....... *H10D 64/671* (2025.01); *H10D 30/0281* (2025.01); *H10D 30/65* (2025.01); *H10D 62/116* (2025.01); *H10D 64/01* (2025.01); *H10D 64/667* (2025.01)

(58) Field of Classification Search
  CPC ............ H10D 30/025; H10D 30/0281; H10D 30/603; H10D 30/65; H10D 64/01; H10D 64/017; H10D 64/667; H10D 64/671; H10D 64/691
  USPC ........................................................ 257/286
  See application file for complete search history.

(56) References Cited

U.S. PATENT DOCUMENTS

| | | |
|---|---|---|
| 9,450,074 B1 | 9/2016 | Yang et al. |
| 9,461,143 B2 | 10/2016 | Pethe et al. |
| 9,577,078 B1 | 2/2017 | Chung et al. |
| 9,905,671 B2 | 2/2018 | Cheng |
| 2015/0035053 A1 | 2/2015 | Singh |
| 2017/0053997 A1 | 2/2017 | Cheng et al. |
| 2017/0365602 A1* | 12/2017 | Zhou ................ H01L 29/66681 |
| 2018/0261677 A1 | 9/2018 | Lee et al. |
| 2018/0277645 A1* | 9/2018 | Xie ................. H01L 21/823481 |
| 2019/0035917 A1 | 1/2019 | Cheng et al. |
| 2019/0348517 A1 | 11/2019 | Wang et al. |
| 2021/0343851 A1* | 11/2021 | Wang ................ H01L 21/28088 |
| 2021/0351293 A1* | 11/2021 | Gu ......................... H01L 29/513 |
| 2021/0407935 A1 | 12/2021 | Li et al. |
| 2022/0059691 A1* | 2/2022 | Shen ................. H01L 29/66659 |
| 2024/0282853 A1 | 8/2024 | Pandey et al. |

OTHER PUBLICATIONS

Search Report in related EP Application No. 22200196.8-1212 dated Aug. 10, 2023, 9 pages.

* cited by examiner

*Primary Examiner* — Fazli Erdem
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a laterally diffused metal-oxide semiconductor with one or more gate contacts and methods of manufacture. The structure includes: sidewall spacers over a semiconductor substrate; and a gate structure within a space defined by the sidewall spacers. The gate structure includes: a plurality of gate materials over the semiconductor substrate and between the sidewall spacers; and a gate electrode over the plurality of gate materials and contacting the sidewall spacers.

20 Claims, 5 Drawing Sheets

LATERALLY DIFFUSED METAL-OXIDE SEMICONDUCTOR WITH GATE CONTACT

BACKGROUND

The present disclosure relates to semiconductor structures and, more particularly, to a laterally diffused metal-oxide semiconductor with one or more gate contacts and methods of manufacture.

A laterally-diffused metal-oxide semiconductor (LDMOS) is a planar double-diffused MOSFET (metal-oxide-semiconductor field-effect transistor) used in amplifiers, such as microwave power amplifiers, RF power amplifiers and audio power amplifiers. For example, silicon-based RF LDMOS (radio-frequency LDMOS) is widely used in RF power amplifiers for mobile networks. More specifically, LDMOS devices are widely used in RF power amplifiers for base-stations as the requirement is for high output power with a corresponding drain to source breakdown voltage.

SUMMARY

In an aspect of the disclosure, a structure comprises: sidewall spacers over a semiconductor substrate; and a gate structure within a space defined by the sidewall spacers. The gate structure comprises: a plurality of gate materials over the semiconductor substrate and between the sidewall spacers; and a gate electrode over the plurality of gate materials and contacting the sidewall spacers.

In an aspect of the disclosure, a structure comprises: a metal gate structure comprising a channel region below sidewall spacers and a gate electrode filling an upper space between the sidewall spacers; a source region adjacent to a first side of the sidewall spacers; a drain region adjacent to a second side of the sidewall spacers and positioned at a distance farther away from the channel region than the source region; and a shallow trench isolation structure between the drain region and the channel region In an aspect of the disclosure, a method comprises: forming sidewall spacers over a semiconductor substrate; and a forming a gate structure within a space defined by the sidewall spacers. The gate structure comprises: forming a plurality of gate materials over the semiconductor substrate and between the sidewall spacers; and forming a gate electrode over the plurality of gate materials and contacting the sidewall spacers.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a laterally diffused metal-oxide semiconductor (LDMOS) with one or more gate contacts and methods of manufacture. More specifically, the present disclosure relates to an LDMOS with an improved gate contact scheme. For example, in embodiments, the LDMOS may be a FinFET P-LDMOS with a gate electrode comprising an increased volume and, hence, exhibiting a lower gate resistance. In further embodiments, the drain region may be farther from the gate structure than the source region, which improves gate to drain capacitance (Cgd). Accordingly, and advantageously, the present disclosure provides RF performance improvement in LDMOS p-FETs, i.e., improved Fmax.

The LDMOS of the present disclosure can be manufactured in a number of ways using a number of different tools. In general, though, the methodologies and tools are used to form structures with dimensions in the micrometer and nanometer scale. The methodologies, i.e., technologies, employed to manufacture the LDMOS of the present disclosure have been adopted from integrated circuit (IC) technology. For example, the structures are built on wafers and are realized in films of material patterned by photolithographic processes on the top of a wafer. In particular, the fabrication of the LDMOS uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
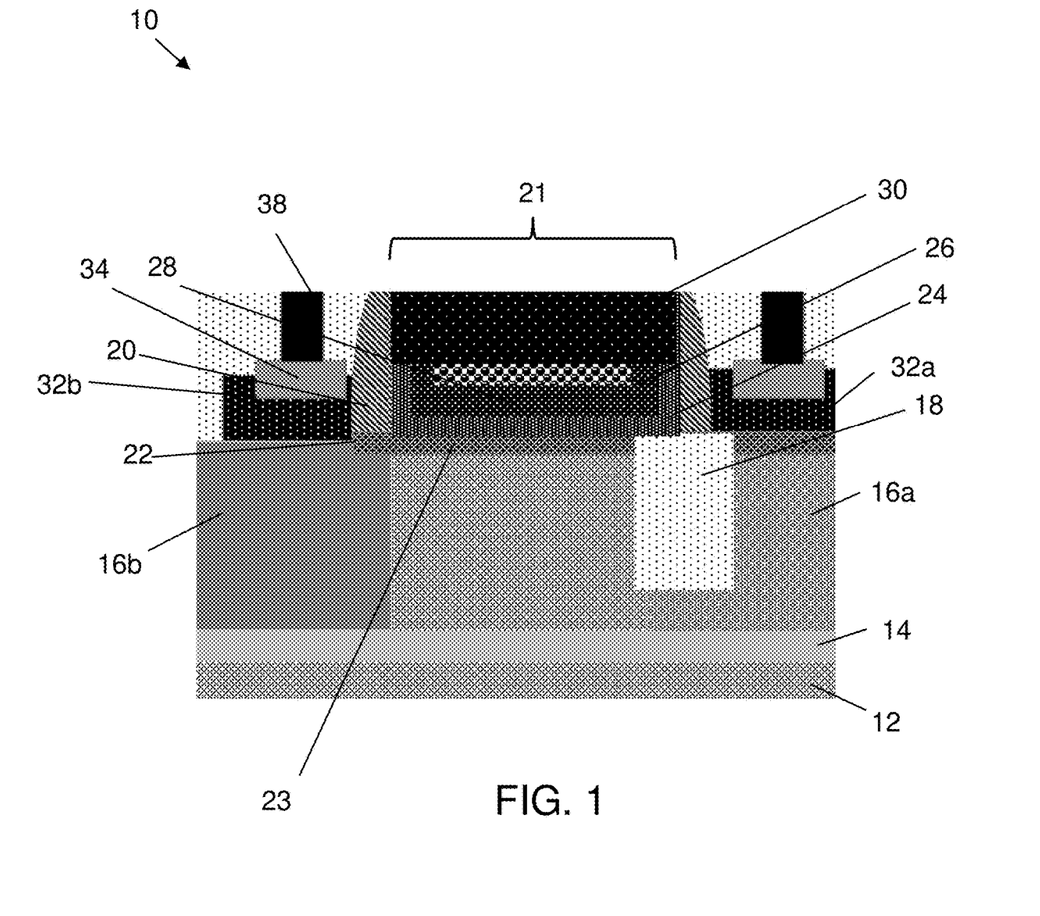
FIG. 1 shows an LDMOS, amongst other features, and respective fabrication processes in accordance with aspects of the present disclosure.

FIG. 1 shows an LDMOS, amongst other features, and respective fabrication processes in accordance with aspects of the present disclosure. In particular, the LDMOS 10 includes a semiconductor substrate 12. In embodiments, the semiconductor substrate 12 may be a P-type substrate composed of any suitable material including, but not limited to, Si, SiGe, SiGeC, SiC, GaAs, InAs, InP, and other III/V or II/VI compound semiconductors. In embodiments, the semiconductor substrate 12 may be a bulk substrate or, alternatively, may be semiconductor on insulator (SOI) technologies. The semiconductor substrate 12 may also comprise any suitable crystallographic orientation (e.g., a (100), (110), (111), or (001) crystallographic orientation).

A deep n-well 14 may be formed in the semiconductor substrate 12. A P-well 16a and an N-well 16b may also be formed in the semiconductor substrate 12. In embodiments, the wells 14, 16a, 16b may be formed by ion implantation processes that introduce a concentration of a dopant in the semiconductor substrate 12. The P-well 16a may be doped with p-type dopants, e.g., Boron (B), and the N-wells 14, 16b may be doped with n-type dopants, e.g., Arsenic (As), Phosphorus (P) and Sb, among other suitable examples, at different concentrations.

Still referring to FIG. 1, one or more shallow trench isolation structures 18 may be formed in the semiconductor substrate 12. The one or more shallow trench isolation structures 18 may be formed on a drain side of the device, within the P-well 16a, for example. The one or more shallow trench isolation structures 18 can be formed by conventional lithography, etching and deposition methods known to those of skill in the art as described in more detail with respect to FIG. 3A.

Sidewall spacers 20 may be formed on the semiconductor substrate 12. In embodiments, the sidewall spacers 20 may be formed over the N-well 16b and the P-well 16a, and more particularly partially over the shallow trench isolation structure 18 that is within the P-well 16a. As described in more detail below with respect to FIG. 3A, the sidewall spacers 20 may be formed using dummy gate fabrication processing schemes. Prior to forming the sidewall spacers 20, an interfacial layer 22 may be provided on the semiconductor substrate 12 under the sidewall spacers 20. In embodiments, the interfacial layer 22 may be an oxide layer, deposited by a conventional deposition method, e.g., atomic layer deposition (ALD), etc.

FIG. 1 further shows a gate structure 21 formed between the sidewall spacers 20, which comprises several layers of stacked materials 24, 26, 28, 30. These stacked layers of material 24, 26, 28, 30 may be formed by conventional deposition methods such as, e.g., chemical vapor deposition (CVD), physical vapor deposition (PVD) including sputtering, ALD or other suitable method. In accordance with the present disclosure, the volume of the gate electrode 30 (e.g., top layer of tungsten) may be significantly increased due to the gate processing schemes described herein. This increased volume results in significant improvement to the gate performance by decreasing gate resistance, e.g., Rgate may be decreased by upwards of approximately 20%. The gate structure 21 may be a FinFET structure.

To form the gate structure 21, a high-k dielectric material 24 may be formed over the interfacial layer 22 and between the sidewall spacers 20. In embodiments, the high-k gate dielectric material 24, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. A workfunction metal 26 may be formed on the high-k dielectric material 24 and between the sidewall spacers 20. In embodiments, the workfunction metal 26 may be, e.g., Ti, TiAlC, Al, TiAl, TaN, TaAlC, TiN, TiC and Co. In one embodiment, TiN is used for a p-FET. As shown, each of the materials 24, 26 comprises a U-shape (e.g., with the material 24 surrounding the bottom and sides of the material 26) due to an etch back process as described with respect to FIG. 3D.

A barrier material 28 may be formed over the workfunction metal 26 and between the sidewall spacers 20. In embodiments, the barrier material 28 may be TaN. Following an etch back process, a gate electrode 30 (e.g., tungsten) may be deposited on the barrier material 28, filling the remaining space between the sidewall spacers 20, e.g., which abuts (e.g., directly contacts) the sidewall spacers 20. As a result of the etch back process, the volume of tungsten (e.g., gate electrode) between the sidewall spacers 20 is significantly increased, thus improving Rgate.

Still referring to FIG. 1, a drain region 32a and a source region 32b may be formed on sides of the gate structure 21. In more specific embodiments, the drain region 32a and the source region 32b are abutting the sidewall spacers 20 of the gate structure 21. In embodiments, the drain region 32a may be farther away from the gate structure 21, e.g., channel region 23, compared to the source region 32b due to location of the shallow trench isolation structure 18. The location of the drain region 32a will lower the drain to gate capacitance (Cgd).

Figure 3A:
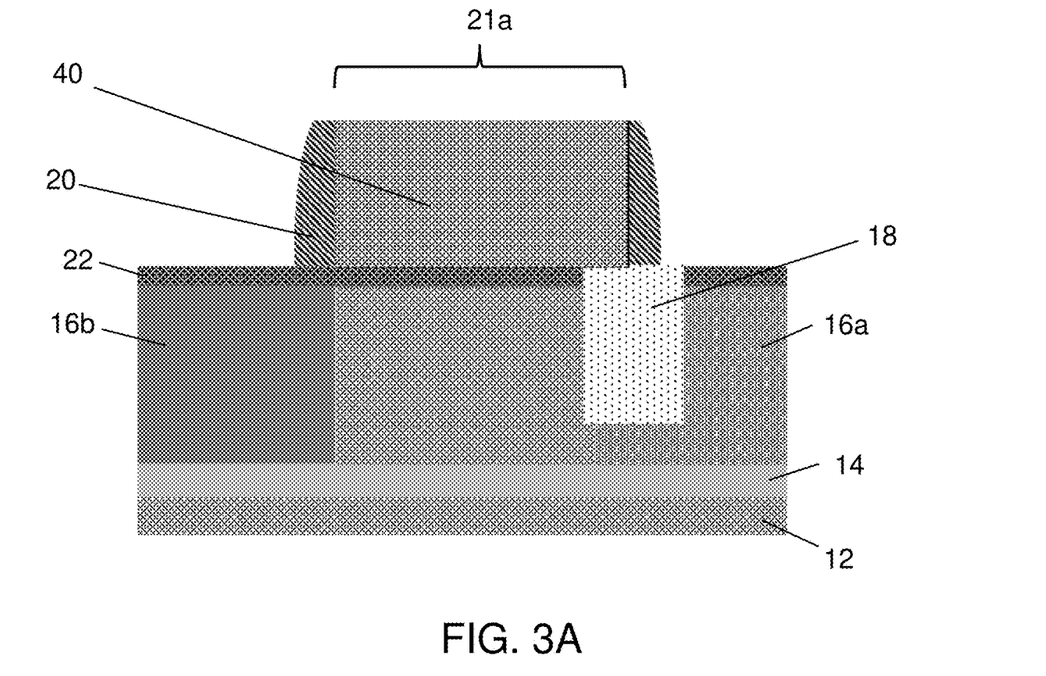
FIGS. 3A-3F show fabrication processes for forming a gate structure, e.g., FinFET, in accordance with aspects of the present disclosure.
Figure 3B:
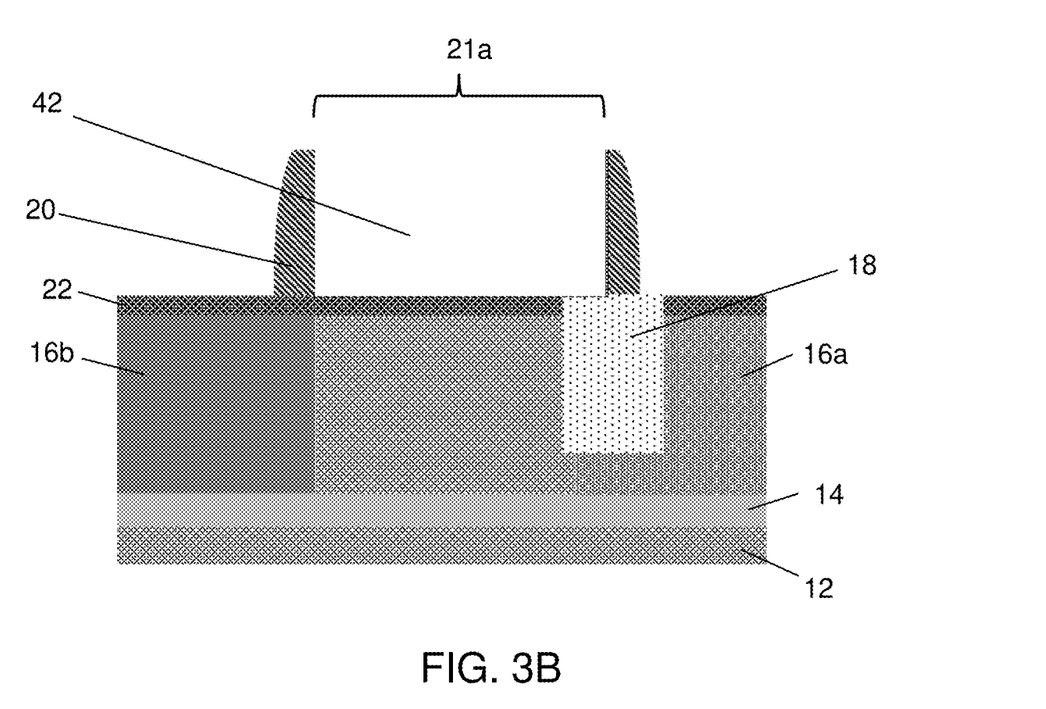
Figure 3C:
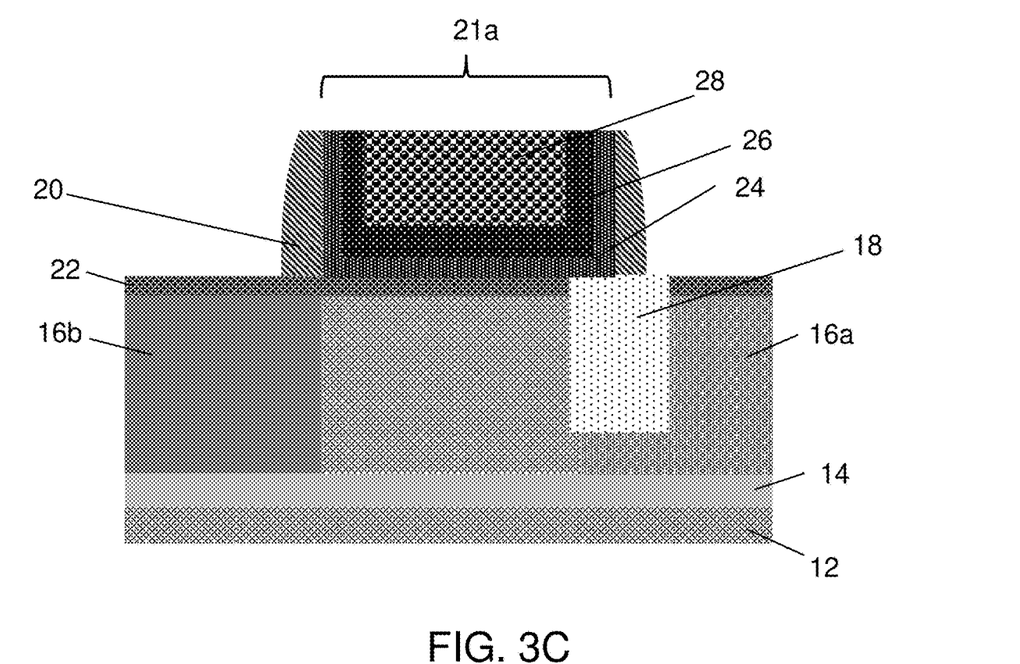
Figure 3D:
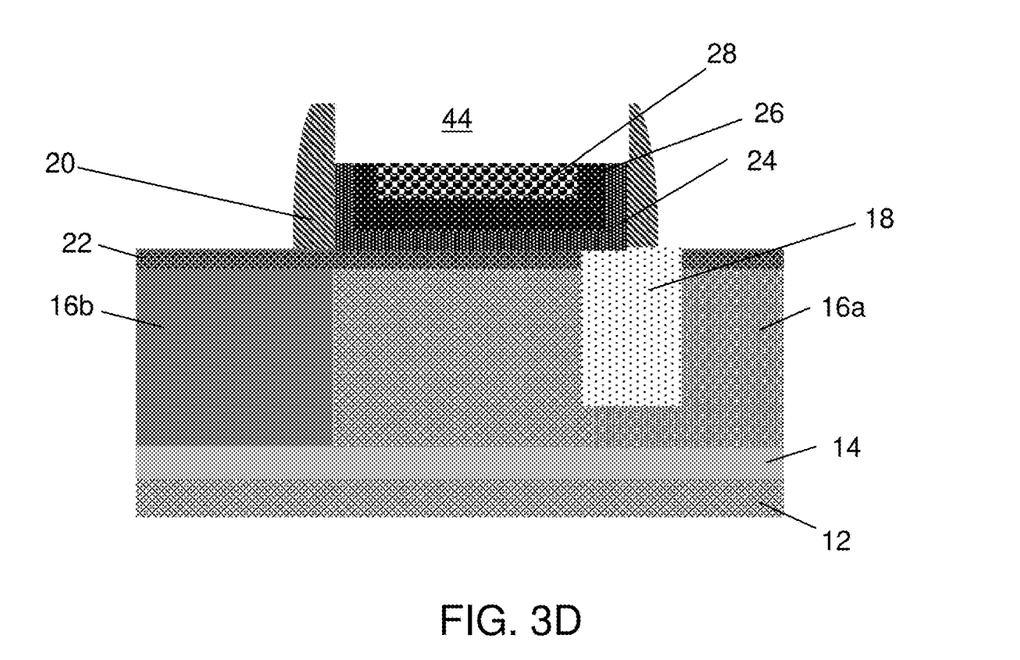
Figure 3E:
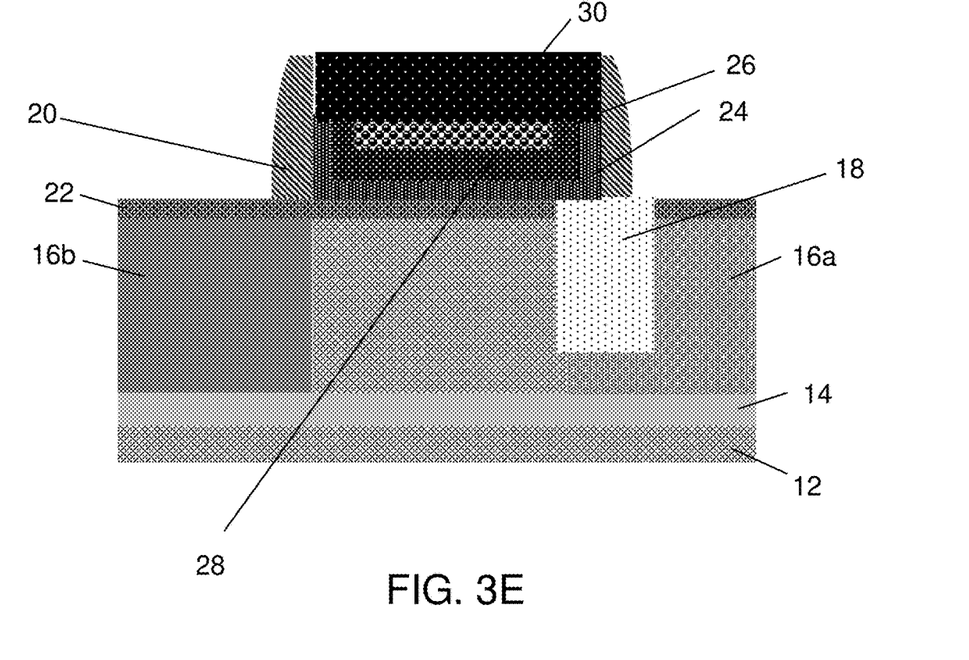
Figure 3F:
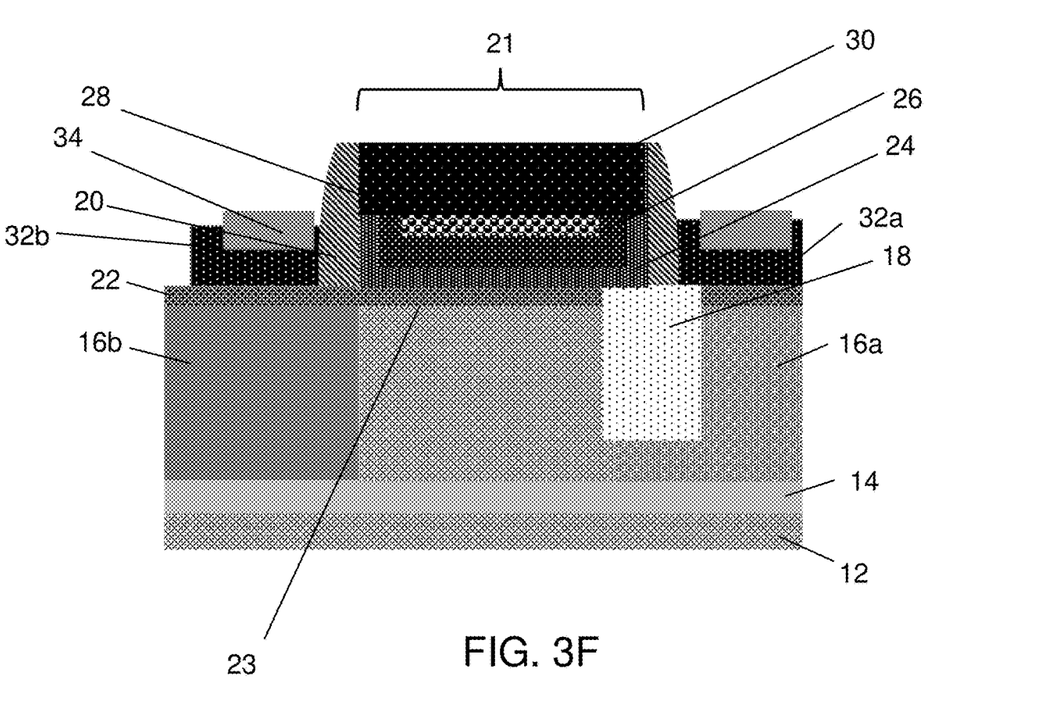

In embodiments, the drain region 32a and the source region 32b may be a raised drain region 32a and a raised source region 32b, fabricated by conventional epitaxial semiconductor growth processes as is known in the art and as described in more detail with respect to FIG. 3F. Also, as described in more detail with respect to FIG. 3F, a silicide contact 34 may be formed on the raised drain region 32a and the raised source region 32b. In embodiments, the silicide contact 34 may be, e.g., NiSi or TiSi.

Contacts 38 may be formed to the silicide contacts 34 and the gate structure 21 (the contact to the gate structure is not shown in FIG. 1). To form the contacts 38, an interlevel dielectric material 36 may be formed over the structure, which is then subjected to a lithography and etching process to form trenches exposing the silicide contacts 34 and the gate structure 21. A conductive material, e.g., aluminum with a liner material such as TiN, may be deposited within the trenches to form the contacts 38. Any residual material formed on a top surface of the interlevel dielectric material 36 may be removed by a conventional CMP process.

Figure 2:
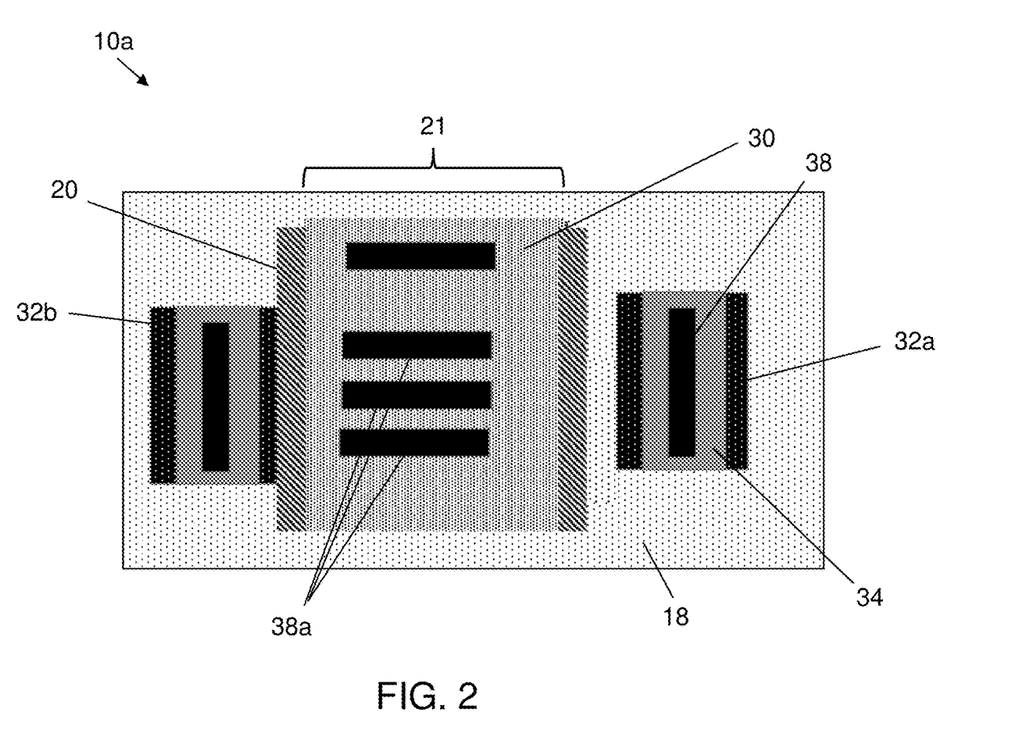
FIG. 2 shows a top view of an LDMOS, amongst other features, in accordance with additional aspects of the present disclosure.

FIG. 2 shows a top view of an LDMOS, amongst other features, in accordance with additional aspects of the present disclosure. In the structure 10a, several contacts 38a may be formed in contact with the gate structure 21. In embodiments, the contacts 38a are parallel to the current flow and in the same plane as the contacts 38 to the source region 32b and the drain region 32a. Further, as shown in this top view, the drain region 32a is farther away from the gate structure 21 than the source region 32. The several contacts 38a may be perpendicularly oriented to the several contacts 38.

FIGS. 3A-3F show fabrication processes for manufacturing the gate structure, e.g., FinFET in accordance with aspects of the present disclosure. FIG. 3A shows a starting structure comprising a dummy gate 21a formed on the semiconductor substrate 12. In this structure, the semiconductor substrate 12 already includes the wells 14, 16a, 16b and the shallow trench isolation structures 18. The wells 14, 16a and 16b, for example, may be formed by introducing a concentration of a different dopant of opposite conductivity type in the substrate. In embodiments, respective patterned implantation masks may be used to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

The shallow trench isolation structures 18 may be fabricated by conventional lithography, etching and deposition processes. For example, a resist is formed over the semiconductor substrate 12 and exposed to energy (light) to form a pattern (opening). An etching process with a selective chemistry, e.g., reactive ion etching (RIE), will be used to transfer the pattern to the semiconductor substrate 12 to form one or more trenches in the semiconductor substrate 12 through the openings of the resist. Following the resist removal by a conventional oxygen ashing process or other known stripants, insulator material, e.g., oxide, can be deposited by any conventional deposition process, e.g., chemical vapor deposition (CVD) process. Any residual insulator material on the surface of the semiconductor substrate 12 can be removed by conventional chemical mechanical polishing (CMP) processes.

Still referring to FIG. 3A, the dummy gate 21a includes sidewall spacers 20 and dummy gate material 40 between the sidewall spacers 20. In embodiments, the dummy gate material 40 may be polysilicon deposited by a conventional CVD process, followed by a conventional patterning process, e.g., lithography and etching process. Following the patterning process, sidewall spacer material may be blanket deposited on the patterned dummy gate material 40. The sidewall spacer material may be oxide and/or nitride material. Following the blanket deposition of the sidewall spacer material, an anisotropic etching process may be performed to form the sidewall spacers 20.

In FIG. 3B, the dummy gate material 40 (e.g., polysilicon material) may be removed from between the sidewall spacers 20. For example, the dummy gate material 40 may be removed by a conventional selective etching process, e.g., RIE, that removes the polysilicon material. By way of an illustrative and non-limiting example, the dummy gate material 40 (e.g., polysilicon material) may be removed by a wet etch or dry etch process. The dry etch process may comprise exposing the dummy gate material to a plasma derived from materials that include, but are not limited to, hydrogen chloride (HCl), chlorine (Cl), sulfur hexafluoride ($SF_6$), hydrogen bromide (HBr), and/or hydrogen iodide (HI). In one embodiment, a hydrogen fluoride (HF) etchant or a conventional wet etchant may be used to remove the dummy gate material. In embodiments, these etching processes may be a maskless etching process, using the selective etch chemistry as is known in the art. In this way, a recess 42 may be formed between the sidewall spacers 20.

As shown in FIG. 3C, the stack of materials 24, 26, 28 may be deposited within the recess 42. For example, a high-k dielectric material 24 may be formed over the interfacial layer 22, a workfunction metal 26 may be formed on the high-k dielectric material 24, and a barrier material 28 may be formed on the workfunction metal 26. In embodiments, the barrier material 28 may completely fill any remaining portions of the recess 42. The high-k dielectric material 24, workfunction metal 26 and barrier material 28 may be deposited using an ALD process, as an example.

In FIG. 3D, the high-k dielectric material 24, workfunction metal 26 and barrier material 28 may be etched back to form a recess 44 between the sidewall spacers 20. In embodiments, the recess 44 may be below a top surface of the sidewall spacers 20. Also, in embodiments, the etch back process may be provided by a conventional RIE process using chemistries that etch or recess the high-k dielectric material 24, workfunction metal 26 and barrier material 28.

In FIG. 3E, following the etch back process, a gate electrode 30 (e.g., tungsten) may be deposited on the barrier material 28, filling the remaining space (e.g., recess) between the sidewall spacers 20. In embodiments, the gate electrode 30 may be deposited by a conventional CVD process, followed by a planarization process, e.g., CMP. The gate electrode 30 will abut against the sidewall spacers 20 and will extend and be in direct contact with each of the materials 24, 26, 28. As a result of the etch back process, the volume of tungsten (e.g., gate electrode) between the sidewall spacers 20 is significantly increased compared to conventional gate structures, thus improving Rgate.

FIG. 3F shows the formation of the drain region 32a, source region 32b and the silicide contacts 34. In embodiments, the drain region 32a and the source region 32b may be a raised drain region 32a and a raised source region 32b, fabricated by epitaxial semiconductor growth processes. In embodiments, the semiconductor material may be Si or SiGe as examples. In accordance with alternative, the epitaxy regions are formed of a III-V compound semiconductor such as GaAs, InP, GaN, InGaAs, InAlAs, GaSb, AlSb, AlAs, AlP, GaP, combinations thereof, or multi-layers thereof. Also, in a p-type FinFET implementation, the p-type impurity may be in-situ doped. An annealing process may be performed to drive in the dopant into the semiconductor substrate 12, e.g., wells 16a, 16b. The annealing process may accordingly provide the drain region 32a and the source region 32b deeper into the semiconductor substrate 12. The shallow trench isolation structure 18 will provide an additional distance between the drain region 32a and the channel region 23 of the gate structure 21.

The drain region 32a may be separated from a channel region 23 of the gate structure 21 by the shallow trench isolation structure 18. That is, the shallow trench isolation structure 18 will effectively make the drain region 32a farther from the gate structure 21 than the source region 32b, which is not separated from the gate structure 21 by any shallow trench isolation structure. Accordingly, by having the drain region 32a further away from the from the gate structure 21, it is now possible to also improve gate to drain capacitance (Cgd).

The silicide contacts 34 may be formed by a silicide process. The silicide process begins with deposition of a thin transition metal layer, e.g., nickel, cobalt or titanium, over fully formed and patterned semiconductor devices (e.g., doped or ion implanted source and drain regions). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 34 in the active regions of the device. It should be understood by those of skill in the art that silicide contacts will not be required on metal material, e.g., gate electrode 30. Contacts are formed as noted with respect to FIG. 1.

The LDMOS can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    sidewall spacers over a semiconductor substrate; and
    a gate structure within a space defined by the sidewall spacers, the gate structure comprising:
        a plurality of gate materials over the semiconductor substrate and between the sidewall spacers, wherein the plurality of gate materials comprise a gate dielectric material that extends over the semiconductor substrate and partially upwards on an interior surface of the sidewall spacers, a workfunction metal that extends over the gate dielectric material, and a barrier material that extends over the workfunction metal, wherein the workfunction material and the gate dielectric material comprise a U-shape with legs of the U-shape of both the workfunction metal and the gate dielectric material and an upper surface of the barrier material being planar; and
        a gate electrode over and contacting with each of the plurality of gate materials and the sidewall spacers.

2. The structure of claim 1, wherein the plurality of gate materials comprises:
    the gate dielectric material over the semiconductor substrate and between the sidewall spacers;
    the workfunction metal over the gate dielectric material and between the sidewall spacers; and
    the barrier material over the workfunction metal and between the sidewall spacers.

3. The structure of claim 2, wherein the gate dielectric material comprises a high-k gate dielectric material.

4. The structure of claim 2, wherein the legs of the U-shape of the gate dielectric material extends upward to partially cover the interior surface of the sidewall spacers.

5. The structure of claim 4, wherein the gate electrode further contacts the gate dielectric material, the workfunction material and the barrier material.

6. The structure of claim 5, wherein the gate dielectric material, the workfunction metal and the barrier material partly fill a space between the sidewall spacers and the gate electrode completely fills a remainder of the space between the sidewall spacers, and the legs of the U-shape of the gate dielectric material directly contact the interior surface of the sidewall spacers.

7. The structure of claim 6, wherein the gate electrode comprises tungsten.

8. The structure of claim 2, further comprising a raised source region and a raised drain region on opposing sides of the sidewall spacers and wherein the gate structure sits entirely on a planar surface of a semiconductor substrate.

9. The structure of claim 8, wherein the drain region is farther away from a channel region of the gate structure than the source region.

10. The structure of claim 9, further comprising a shallow trench isolation structure between the drain region and the channel region of the gate structure, the shallow trench isolation structure having a planar upper surface which is contiguous and planar with the planar region of the semiconductor substrate, and the gate dielectric material extending over both the planar region and the contiguous shallow trench isolation structure.

11. The structure of claim 8, further comprising a plurality of contacts to the gate electrode, which are oriented in a direction of current flow and in a same plane as contacts to the source region and the drain region.

12. A structure comprising:
    a metal gate structure comprising a channel region below sidewall spacers and a gate electrode, a gate dielectric material, a workfunction metal and a barrier material between the gate electrode and the barrier layer filling an upper space between the sidewall spacers, the gate dielectric material, the workfunction metal and the barrier material being planar, and the gate electrode contacting each of rate dielectric material, the workfunction metal, the barrier layer and an interior surface of the sidewall spacers;
    a source region adjacent to a first side of the sidewall spacers;
    a drain region adjacent to a second side of the sidewall spacers and positioned at a distance farther away from the channel region than the source region; and
    a shallow trench isolation structure between the drain region and the channel region, wherein the drain region overlaps onto an upper surface of the shallow trench isolation structure and contacts an exterior surface of the second side of the sidewall spacers.

13. The structure of claim 12, wherein the gate structure further comprises a plurality of gate materials under the gate electrode, the plurality of gate materials comprises:
    the gate dielectric material over a semiconductor substrate and between the sidewall spacers, the gate dielectric material further extending upwards and in contact with an interior surface of the sidewall spacers;
    the workfunction metal over the gate dielectric material and between the sidewall spacers the workfunction metal further extending upwards with respect to the interior surface of the sidewall spacers and in contact with the gate dielectric material that is in contact with the interior wall of the sidewall spacers; and
    the barrier material over the workfunction metal and between the sidewall spacers.

14. The structure of claim 13, wherein the gate dielectric material comprises a high-k dielectric material.

15. The structure of claim 14, wherein the gate electrode contacts the gate dielectric material, the workfunction material and the barrier material.

16. The structure of claim 15, wherein the gate dielectric material, the workfunction metal and the barrier material completely fill a space between the sidewall spacers underneath the gate electrode and the gate electrode completely fills a remainder of the space between the sidewall spacers, the gate dielectric material and the workfunction metal are U-shape with legs of the U-shape extending upwards along the interior surface of the sidewall spacers.

17. The structure of claim 12, wherein the source region and the drain region are a raised source region and a raised drain region.

18. The structure of claim 12, wherein the gate electrode comprises tungsten.

19. The structure of claim 12, further comprising a plurality of contacts to the gate electrode, which are oriented in a direction of current flow and in a same plane as contacts to the source region and the drain region.

20. A method comprising:
    forming sidewall spacers over a semiconductor substrate; and
    forming a gate structure within a space defined by the sidewall spacers, the gate structure comprising:
        forming a plurality of gate materials over the semiconductor substrate and between the sidewall spacers, wherein the plurality of gate materials comprise a gate dielectric material that extends over the semiconductor substrate and partially upwards on an interior surface of the sidewall spacers, a workfunction metal that extends over the gate dielectric material, and a barrier material that extends over the workfunction metal, wherein the workfunction material and the gate dielectric material comprise a U-shape with legs of the U-shape of both the workfunction metal and the gate dielectric material and an upper surface of the barrier material being planar; and forming a gate electrode over and contacting the plurality of gate materials and the sidewall spacers.

\* \* \* \* \*